United States Patent [19]

Smayling et al.

[11] Patent Number: 5,319,564
[45] Date of Patent: * Jun. 7, 1994

[54] METHOD AND APPARATUS FOR INTEGRATED CIRCUIT DESIGN

[75] Inventors: Michael C. Smayling, Missouri City; Georges Falessi, Sugarland, both of Tex.

[73] Assignee: Texas Instruments Incorporated, Dallas, Tex.

[ * ] Notice: The portion of the term of this patent subsequent to Sep. 14, 2010 has been disclaimed.

[21] Appl. No.: 41,743

[22] Filed: Apr. 1, 1993

Related U.S. Application Data

[62] Division of Ser. No. 632,256, Dec. 21, 1990, Pat. No. 5,245,543.

[51] Int. Cl.$^5$ ............................................. G06F 15/46
[52] U.S. Cl. ..................................... 364/468; 364/490
[58] Field of Search ...................... 29/830; 324/158 T; 364/490, 547, 468, 488, 489

[56] References Cited

U.S. PATENT DOCUMENTS

| | | |
|---|---|---|
| 4,488,354 | 12/1984 | Chan et al. . |
| 4,763,289 | 8/1988 | Barzilai et al. . |
| 4,796,194 | 1/1989 | Atherton et al. . |
| 4,807,108 | 2/1989 | Ben-Arieh et al. . |
| 4,817,012 | 3/1989 | Cali . |
| 5,084,824 | 1/1992 | Lam et al. . |

Primary Examiner—Jerry Smith
Assistant Examiner—Jim Trammell
Attorney, Agent, or Firm—Ira S. Matsil; James C. Kesterson; Richard L. Donaldson

[57] ABSTRACT

An integrated circuit is designed by determined the devices comprising the integrated circuit and determining the desired parameters for each device. A flow of process steps is determined and the 1-D and 2-D simulations are performed on the process flow. The process steps are modified until the simulations determine that the desired parameters are met.

25 Claims, 3 Drawing Sheets

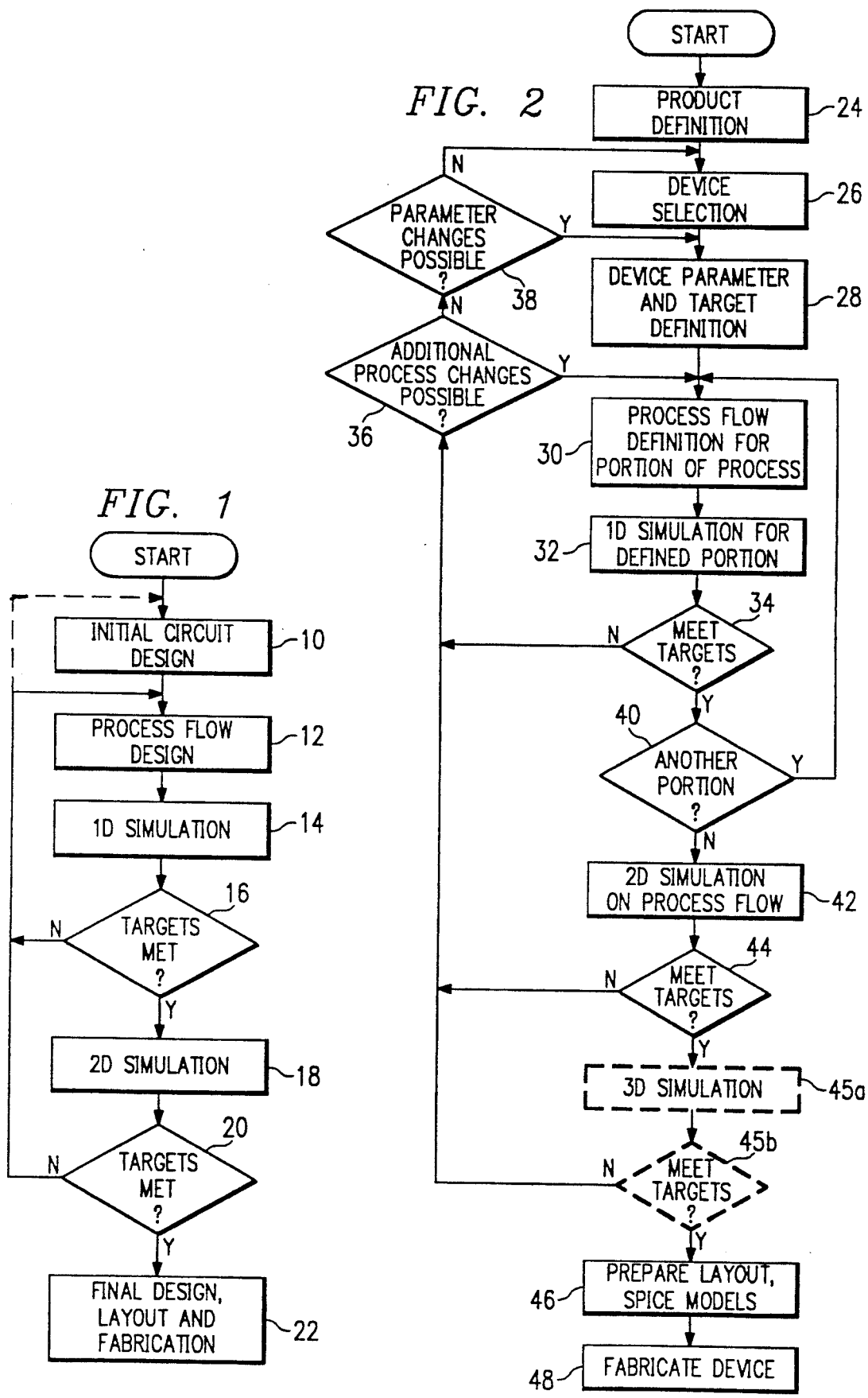

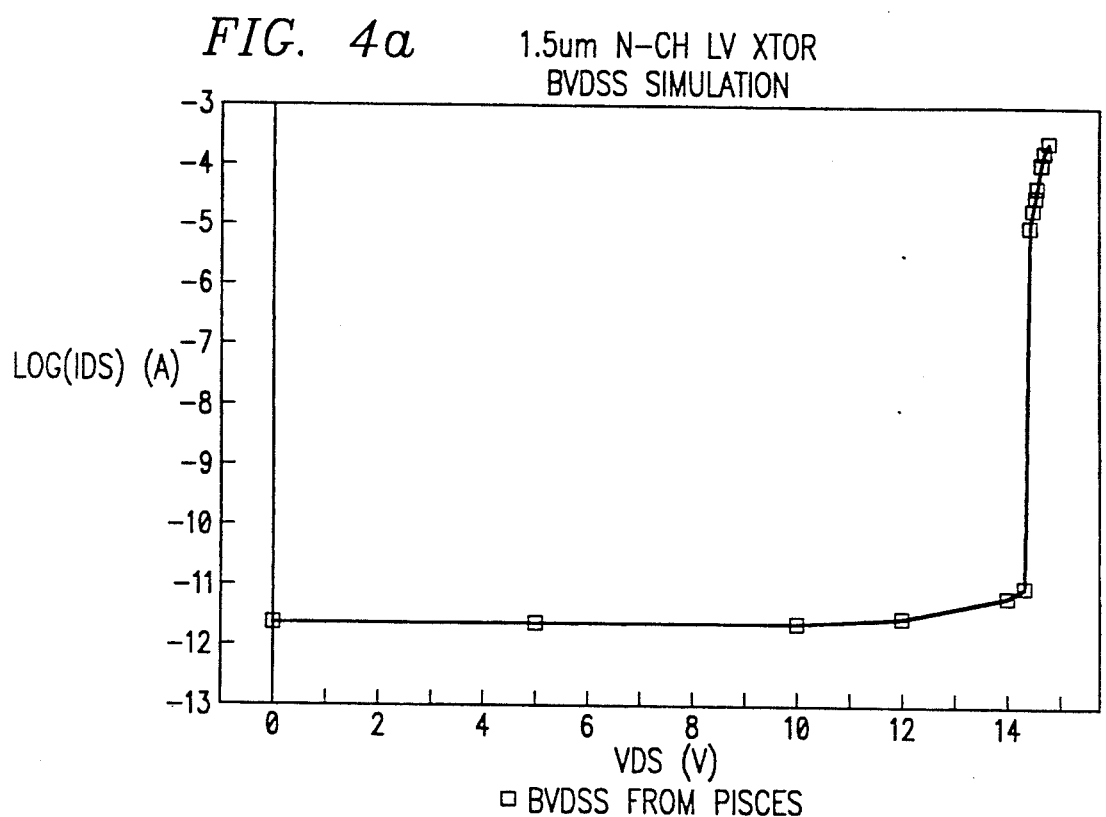
FIG. 4a  1.5um N-CH LV XTOR BVDSS SIMULATION
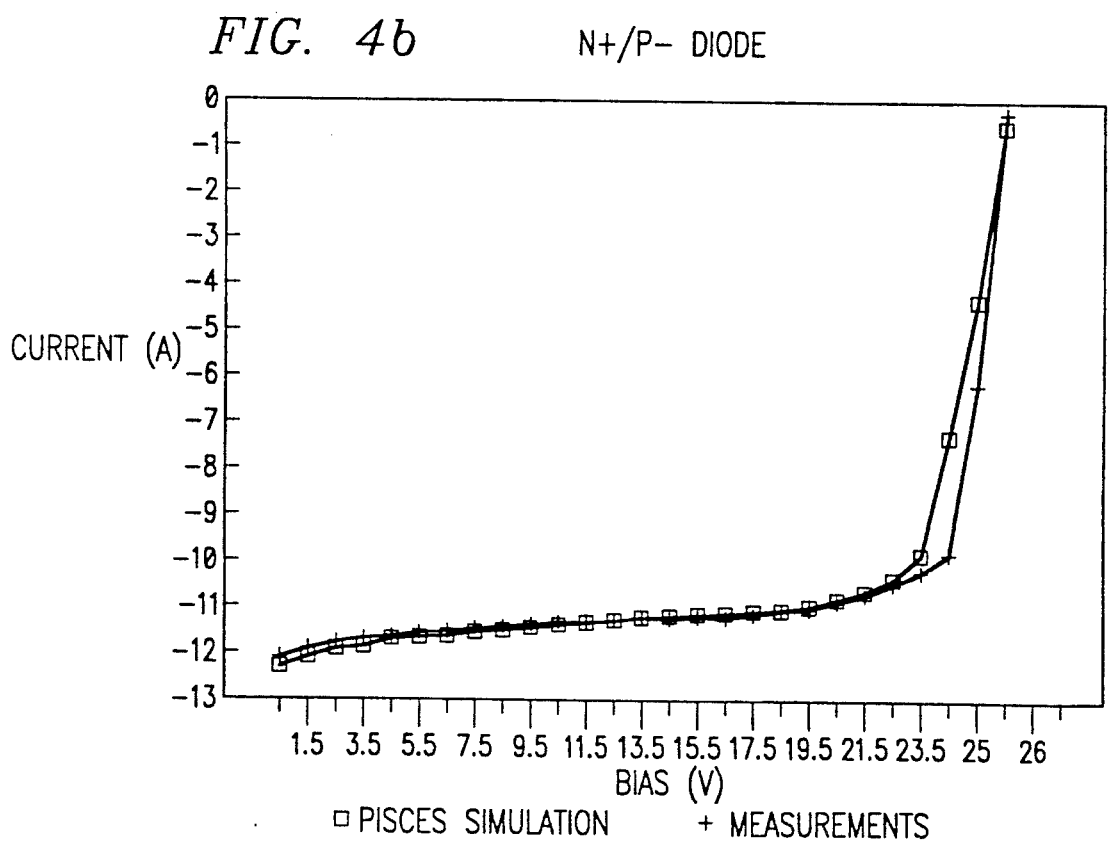
FIG. 4b  N+/P- DIODE

METHOD AND APPARATUS FOR INTEGRATED CIRCUIT DESIGN

This is a division of application Ser. No. 07/632,256, filed Dec. 21, 1990, U.S. Pat. No. 5,245,543.

NOTICE (C) Copyright, Texas Instruments Incorporation 1990. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

TECHNICAL FIELD OF THE INVENTION

This invention relates in general to integrated circuits, and more particularly to integrated circuit design.

BACKGROUND OF THE INVENTION

The design of an integrated circuit is a complex process which requires substantial effort and time. Increasingly, integrated circuits are required for custom applications requiring memory (volatile and nonvolatile) and logic. Two important factors in designing an integrated circuit are the design time and the reliability of the integrated circuit. While programmable logic arrays can be used in some simple applications to reduce design time, more complex functions must be designed from scratch, thus requiring a significant engineering effort.

In the prior art, a circuit designer generates a rough schematic of the circuit to determine what devices will be needed. Typically, the devices include capacitors, resistors, EPROMs, EEPROMs, thyristors, diodes, and transistors (including CMOS, DMOS, bipolar and drain-extended (DE) transistors)). Further, the parameters of the needed devices are defined. The circuit designer consults with the process flow engineer to develop a set of devices which will meet the criteria previously defined.

After deciding on the devices and the parameters, the process flow engineer determines a process flow for fabricating the devices. Importantly, the process flow designer will determine implant doses and diffusion times, high temperature oxidation times, sheet resistances, and a proper sequence of process steps. Once the process flow has been determined, a test wafer may be fabricated which forms the desired devices.

Defining a process flow is an inexact science, which is made more complex because of the process variations which normally occur during wafer fabrication. A typical wafer fabrication cycle is 3-4 months. Once the wafer is fabricated, the devices may be tested and compared to the predetermined parameters. Generally, one or more of the devices will not meet the specifications and changes to the process flow or the circuit design must be made and another wafer fabricated.

Repeated test wafer fabrications result in significant delays in the design of the integrated circuit. If problems occur, it is difficult to determine which processing steps are at the source of the problem. Further, it is extremely difficult to design a circuit which is tolerant to process variations, since the process variations cannot be accurately imitated. In some instances, it may be fruitful to force processing variations during the fabrication of the test wafers; however, for every intentional variation, several unintentional process variations will likely occur.

Thus, there is a need in the industry for a method of designing integrated circuits which reduces the design time and increases the reliability and resistance to process variations of the integrated circuits.

SUMMARY OF THE INVENTION

In accordance with the present invention, a method and apparatus for designing integrated circuits is provided which substantially reduces the problems associated with prior such methods and apparatus.

In one aspect of the present invention, the devices comprising the integrated circuit are determined along with their desired associated parameters. A flow of process steps to fabricate the devices is determined. The process flow is simulated to derive parameters associated with the devices. The derived parameters are compared with the desired parameters and the process steps are modified until predetermined target values are met.

The present invention provides significant advantages over the prior art. The simulation of the devices may be performed in a short time period and the process flow may be modified immediately after the simulation until the desired device criteria are met. Further, the simulation allows a single process step to be modified without confusion caused by unintended process variations. Accordingly, a more reliable design may be produced.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a flow chart describing the overall operation of the preferred embodiment of the present invention;

FIG. 2 illustrates a detailed flow chart of the preferred embodiment;

FIGS. 4a-b illustrate parameter data generated by the 2-D electrical simulator.

DETAILED DESCRIPTION OF THE INVENTION

Figure 3A:
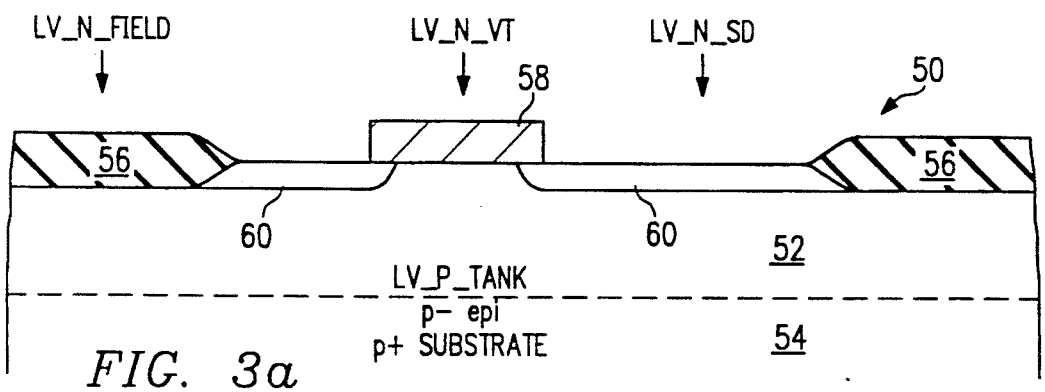
FIGS. 3a-b illustrate a NMOS transistor model and an associated 1-D dopant concentration curve.

The preferred embodiment of the present invention and its advantages are best understood by referring to FIGS. 1-4 of the drawings, like numerals being used for like and corresponding parts of the various drawings.

FIG. 1 illustrates a flow diagram of the general operation of the preferred embodiment of the present invention. More detailed steps of the preferred embodiment are described in connection with FIG. 2.

In block 10, the initial circuit design is performed. The first step in the initial circuit design would be defining the product. For example, if the product is a multiplier, the size of the operands and the product would be specified along with the maximum propagation delay. Further, the operating conditions, such as supply voltage, high-level output voltage, low-level output current, and operating temperature range would be specified. From the product definition, a rough circuit is formed in order to determine what devices will be needed to realize the circuit. Along with selecting the devices, the necessary characteristics of each device are specified. For example, if a MOS transistor is selected, voltage threshold and a transconductance parameters would be specified.

After the initial circuit design, the process flow for fabricating the selected devices is designed in block 12. Typically, the process flow is designed in stages, using a top-down approach. In a top-down approach, the latter stages of the process are designed first, moving sequentially backward through the stages. By designing the process from back to front, all high temperature cycles to be performed in later processing steps are known.

In block 14, the 1-D simulation is performed. In 1-D simulation, dopant concentrations through the wafer in a single direction are calculated. This data may be used to calculate parameters such as voltage threshold. 1-D simulation assumes devices have a long, wide channel to derive parameters such as voltage threshold.

In decision block 16, it is determined whether or not the targets specified in block 10 associated with the parameters derived through the 1-D simulation have been met. If not, the process flow is adjusted in order to meet the target. The loop of adjusting the process flow and performing the 1-D simulation is performed on a processing stage until the targets are met. In some instances, it may be necessary to modify the initial circuit design of block 10 if targets cannot be met for the specified devices.

Once the targets are met in decision block 16, 2-D simulation is performed in block 18. The 2-D simulation includes 2-D process simulation to get two dimensional doping profiles to be used as input to a 2-D electrical simulator, which generates i–v curves.

If targets are not met in decision block 20, the process flow design in block 12 is readjusted and the 1-D and 2-D simulations in blocks 14 and 18 are repeated until the targets can be met. Again, in rare instances, it will be necessary to adjust the initial circuit design in block 10. Once the targets are met, the final design, layout and fabrication is performed in block 22.

The preferred embodiment described above provides significant advantages over the prior art. First, the time to simulate processing steps is exceeding fast in comparison with the time needed for fabrication, which ranges in the 3–4 month range. Further, simulation allows processing steps to be isolated in order to determine their effect on the overall process. Third, process simulation allows "top-down" approach described above, in which the process flow for the later stages may be defined first, continuing with the process flow design for successively earlier stages. Fourth, process variations may be simulated while holding other process specifications constant, in order to determine each process step's effect on the overall process. Fifth, as more merged technology processes, such as biCMOS or Smartpower, are developed, the interaction between processes and devices become very complex. Compromises in device parameters need to be evaluated, which is very difficult without simulation.

FIG. 2 illustrates a more detailed block diagram of the preferred embodiment. In block 24, the product is defined. The specifications for the product would depend upon the particular product, but would include specifications such as propagation delay, settling time, input voltages, output voltages, and other specifications typically found on a data sheet for the device.

From the product definition, a circuit is developed which will implement the defined functions and meet the defined parameters. TABLE 1 provides a list of devices typically used in designing a circuit. Some devices, such as capacitors, may be fabricated using a number of different structures. For example, a MOS capacitor may be desirable from a process flow standpoint because of its simplicity of fabrication, while a polysilicon-to-polysilicon capacitor may be desirable from a circuit standpoint due to its voltage coefficient of capacitance. Thus, the circuit designer and process flow designer will normally communicate during the device selection in order to determine the advantages and disadvantages of the various options.

TABLE I

Capacitors
EPROMs
EEPROMs
Transistors
    MOS
    DMOS
    DE (drain extended)
    Bipolar
Thyristors
Diodes
Resistors
any bipolar or MOS structure Additionally, the desired characteristics of each device are decided upon. The parameters for each device typically correspond to the parameters needed for a SPICE evaluation of the circuit. TABLE 2 provides a list of SPICE parameters for each device listed in TABLE 1. While device sizes may be determined at this point, the other layout depend criteria, such as emitter area and channel length, are not determined until after defining the process flow and performing simulation.

TABLE II

| Spice Parameters for Representative Devices | |
|---|---|
| Capacitors | nominal capacitance |
| | voltage coefficient |
| | temperature coefficient |
| | breakdown voltage |
| EPROMs/EEPROMS | programming voltage, $V_t$, t' |
| Transistors | |
| MOS | $V_t$, k',breakdown voltage |
| DMOS, DE | $V_t$, k',drain breakdown voltage |
| Bipolar | beta/hfe (gain), base- |
| | collector breakdown voltage |
| Thyristors | turn-on voltage, reverse |
| | blocking voltage |
| Diodes | forward voltage drop, reverse |
| | leakage current |
| Resistors | nominal resistance, |
| | temperature coefficient, and |
| | voltage coefficient |

In block 30, the process flow to build the devices is determined. Determining the process flow involves determination of the sequence of process steps and the conditions of those steps. The sequence of process steps would involve determining the types of tanks in which to build the active devices, the oxide thicknesses, the number of levels of polysilicon and the number of levels of metal. The conditions of steps involves the implant dose and implant energy, the oxidation temperature, oxidation times and oxidation ambient (oxygen or steam) and the diffusion temperature, diffusion times and diffusion ambient (typically oxygen or nitrogen).

In order to simplify the variables which affect the process flow, a top-down approach is used, as described hereinabove. In the top-down approach, the later process steps are defined and simulated first. For example, the source/drain implants are generally performed in the later cycles of a semiconductor fabrication process flow. The important parameters for the source/drain implants are the implant doses, implant energy, diffusion temperature, diffusion time and diffusion ambient. The source/drain implants must meet targets for sheet resistance and junction depth. Once the source/drain implants meet the desired criteria, the process steps for forming the low voltage CMOS transistors may be defined. For the low voltage CMOS transistors, the channel regions are simulated separate from the diffused regions to determine $V_t$, $K'$ (transconductance), and breakdown voltage. For a merged process, after defining the low voltage CMOS transistors, the process steps for the high voltage tanks may be defined. Since the temperature cycles for the rest of the process are known at this point, it is easier to develop accurate processing steps at an earlier stage.

Another method of improving the speed with which the process flow may be defined to meet the desired parameters is to simulate multiple devices with varied implant doses, energy, diffusion times, and so on, in order to determine which device provides the optimum performance for its intended function.

In block 32, the 1-D simulation is performed on the process flow determined in block 30. The 1-D simulation provides information on diffused regions, specifically the dopant concentration as a function of distance. The concentration information is developed from a single point which extends from the top of the device through the substrate (a "cross section").

Referring to FIG. 3a for exemplary purposes, a NMOS transistor 50 comprising a p type tank 52 formed in a p− epitaxial layer over a p+ substrate (collectively referred to by reference numeral 54) is illustrated. The MOS transistor 50 is isolated by field oxide regions 56. A gate 58 is formed between the field oxide regions 56 and diffused regions 60, forming the source and drain of the transistor 50. The source and drain of the transistor 50 are formed in the p type tank 52 adjacent the gate 58. Various cross-sections are defined for the NMOS transistor 50; the illustrated cross-sections are named "LV_N_field, LV_N_VT and LV_N_SD". Depending upon the device, different cross-sections may be desirable.

Figure 3B:
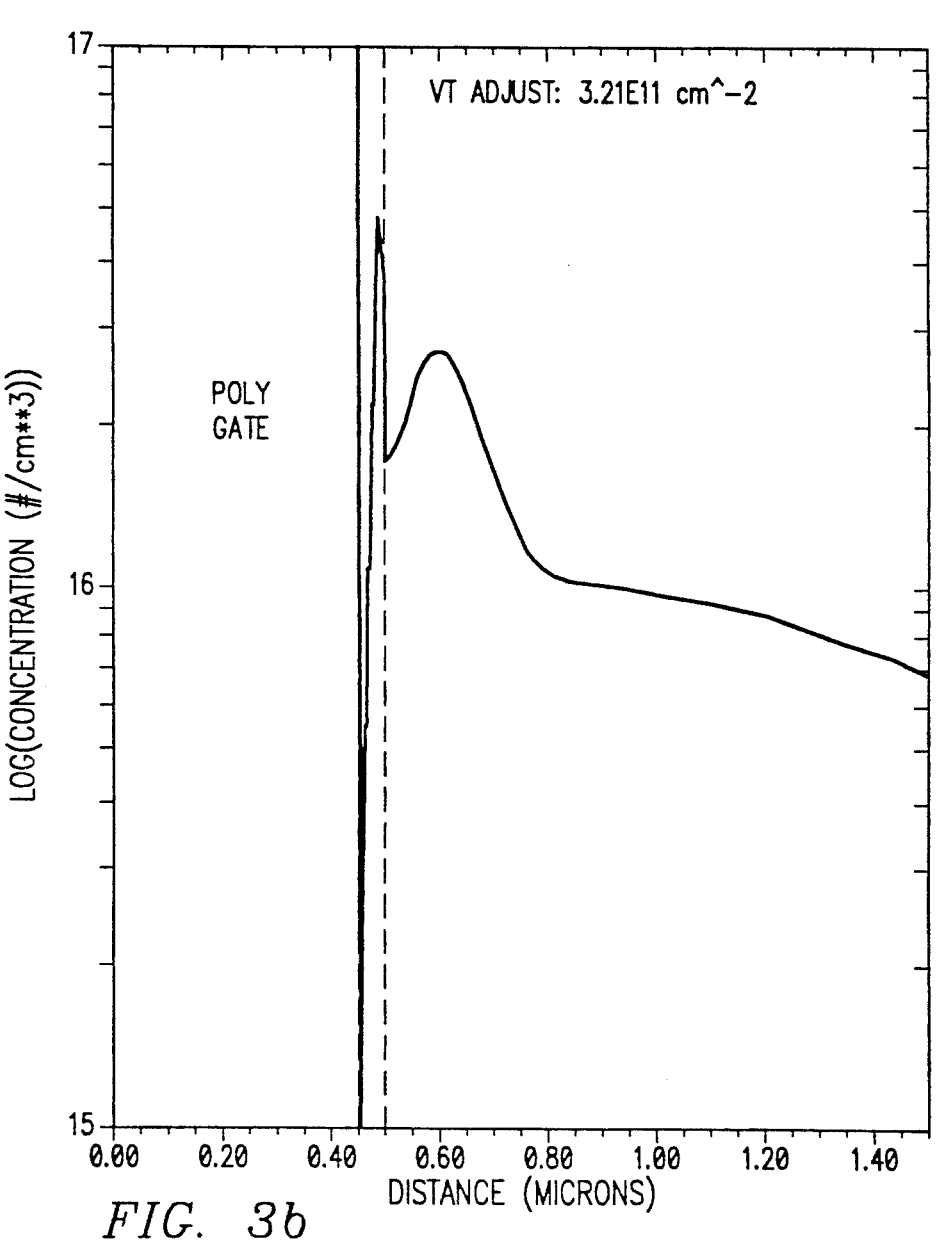

In FIG. 3b, a concentration profile is shown for a specified voltage threshold adjustment implant. The 1-D simulation program can be designed to vary one or more parameters, such as the voltage threshold implant dose, until a target value, such as a calculated voltage threshold, is met.

Referring again to FIG. 2, of the preferred embodiment, the 1-D simulation program used in block 32 is the "SUPREM" simulation program distributed by Technical Modeling Associates (TMA) of Palo Alto, Calif. The source code of an exemplary program, which modifies the voltage threshold dose until a target voltage threshold of 0.85 is met, is illustrated in the Appendix A.

The voltage threshold can be determined from the dopant concentration profile by assuming the MOS device has a wide, long channel. Generally, the 1-D simulation is intended to determine a rough process sequence which is within an order of magnitude of an optimal sequence. If, for example, short channel transistors are being used, it can be deduced that the voltage threshold will be lower and thus, the voltage threshold adjust dose will be lower. The optimal dose can be determined when the 2-D simulations are performed in block 42.

After the 1-D simulation is performed, it is determined whether the targets have been met in decision block 34. If not, iterations of the process flow definition (block 30) and 1-D simulation (block 32) are performed until additional process changes are not possible in decision block 36. If additional process changes are not possible in block 36, then the device parameters and targets may be changed in block 28. If further parameter changes are not possible, it may be necessary to alter the list of devices provided in block 26.

Once the targets are met in decision block 34, the next portion of the process flow is defined in block 30, if there are remaining stages of the process flow to be defined. The loop of defining a process and performing 1-D simulations is continued until all stages of the process flow have been defined such that the targets associated with the 1-D simulation are met.

After all stages of the process flow are met, the 2-D simulation is performed on the process flow in block 42. In the preferred embodiment, the "SUPRA" 2-D simulation program from Technical Modeling Associates is used for the 2-D process simulations which provide doping profiles and the "PISCES" program from Technical Modeling Associates is used to perform the 2-D electrical simulations. The doping profiles generated by the SUPRA program are used as inputs to the PISCES program, which generates i-v (current-voltage) curves.

As opposed to the 1-D simulation, 2-D simulation programs take channel length into account. The ultimate goal of the 2-D simulation is to generate i-v curves, such as drain current vs. drain voltage, from which important data on breakdown voltage, junction breakdown, capacitances and resistances may be determined. The derived parameters are compared to the targets in decision block 44. If the targets are not met, the process flow may be adjusted in block 30 or device parameters and targets may be changed in block 28 as described hereinabove for the 1-D simulation. In some instances, the device selection will need to be changed in block 26 if further changes to the process flow and to the parameters are not possible.

Referring to FIGS. 4a-b, a BVDSS (Breakdown voltage drain-to-source, with gate shorted to source) and a diode simulation generated by the PISCES program is illustrated.

Generally, the most critical problems ascertained by the 2-D simulation involve the breakdown voltages and the junction breakdowns, both of which relate to the doping of the tank regions. Since the doping of the tanks is an early step in the process flow, changing the tanks requires modification of the other process steps for devices built in the changed tanks. Hence, a 1-D simulation is generally performed after changing the process flow taking into account the changed tank parameters.

Referring again to FIG. 2, after the targets are met in decision block 44, an optional 3-D simulation may be performed in block 45a. A 3-D simulation program is available from Technical Modeling Associates under the mark "DAVINCI". The 3-D simulation is necessary to model transistors with both a short channel and a narrow width. Since very few narrow transistors are used in circuit design, this step is typically not necessary. If the 3-D simulation is used, an iterative loop is performed as described hereinabove in connection with the 1-D and 2-D simulations, controlled by decision block 45b.

After the targets are met for the 3-D simulation, (or if the 3-D simulation is not used) a layout of the circuit using the devices specified in block 26 and the parameters specified in block 28 is designed. A SPICE simulation using the parameters derived from the I–V data of the 2-D simulation program is performed to simulate the entire circuit. Once the SPICE model is complete, wafers using the layout may be fabricated and tested to ensure proper operation of the circuit.

During the iterations through the process flow definition block 30, various combinations of process steps may be tested to determine the effect of process variations on the device parameters. Since each processing step, or a desired combination of processing steps, can be isolated from the other processing steps, accurate information on the effect of process variations may be derived through the simulations.

The present invention provides significant advantages over the prior art. First, the time for development of complex circuits is drastically reduced, since each simulation requires minutes rather than months to complete. Second, testing of the process flow is more accurate, since the effect of a change in a processing step may be isolated. Third, devices can be more easily optimized by simulating the processing steps for a plurality of similar devices and determining which provides the optimum parameters.

Although the present invention and its advantages have been described in detail, it should be understood that various changes, substitutions and alterations can be made herein without departing from the spirit and scope of the invention as defined by the appended claims.

APPENDIX A

| | |
|---|---|
| ASSIGN | NAME-LVP.DOSE N.VALUE=2.5E12 |
| ASSIGN | NAME-LVN.DOSE N.VALUE=8.0E12 |
| ASSIGN | NAME-HVP.DOSE N.VALUE=1.4E12 |
| ASSIGN | NAME-HVN.DOSE N.VALUE=2.5E12 |
| ASSIGN | NAME-EPI.TOP N.VALUE=5.0E14 |
| ASSIGN | NAME-SUBSTRAT N.VALUE=5.0E14 |
| ASSIGN | NAME-HVN.TIME N.VALUE=250 |
| ASSIGN | NAME-EVTP.DOS N.VALUE=5.5E11 |
| ASSIGN | NAME-EVTN.DOS N.VALUE=7.35E11 |
| ASSIGN | NAME-IN.FILE C.VALUE="ee_nmos_pwell.1" |
| COMMENT | INITIALIZE EPI SUBSTRATE |
| INITIALIZE | <100> SILICON BORON-&SUBSTRAT THICKNESS=4.00 |
| $+ | SPACES=50 XDX=0.0 DX=0.2 |
| GRID | LAYER.1 DX=0.002 SPACES=300 XDX=0.0 |
| COMMENT | >>>>PROCESS STARTS HERE<<<< |
| $EPITAXY | TIME=30, TEMPERAT=1200 BORON=&EPI.BOT THICKNESS=10.00 DX=0.2 |
| $+ | SPACES=A50 XDX=0.0 |
| COMMENT | INITIAL OXIDE 400A - STEAM |
| $DEPOSITION | OXIDE THICKNESS=0.04 |
| $DIFFUSION | TEMPERATURE=900 TIME=48 NITROGEN |
| COMMENT | N-BL ANTIMONY IMPLANT |
| $IMPLANT | ANTIMONY DOSE=1E16 ENERGY=80 RP.EPI |
| COMMENT | N-BL ANNEAL |
| $DIFFUSION | TEMPERATURE=1100 TIME=30 NITROGEN |
| COMMENT | ETCH 1ST OXIDE |
| $ETCH | OXIDE |
| $EPITAXY | TIME=30, TEMPERAT=1200 BORON=&EPI.TOP THICKNESS=15.00 DX=0.2 |
| $+ | SPACES=100 XDX=0.0 |
| COMMENT | INITIAL OXIDE 400A - STEAM |
| $DEPOSITION | OXIDE THICKNESS=0.04 |
| $DIFFUSION | TEMPERATURE=900 TIME=48 NITROGEN |
| COMMENT | INITIAL NITRIDE LPCVD - 1300A |
| $DEPOSITION | NITRIDE THICKNESS=0.13 TEMP=800 |
| COMMENT | N-TANK PATTERN - LEVEL 01 |
| COMMENT | ETCH NITRIDE AND OVERETCH 1ST OXIDE 100A |
| $ETCH | NITRIDE |
| $ETCH | OXIDE THICKNESS=0.01 |
| COMMENT | N-TANK PHOSPHORUS IMPLANT |
| $IMPLANT | PHOSPHOR DOES=$HVN.DOSE ENERGY=80 RP.EPI |
| COMMENT | HIGH-VOLTAGE N-TANK DRIVE |
| $IFFUSION | TEMPERATURE=900 TIME=20 NITROGEN TED |
| $DIFFUSION | TEMPERATURE=900 TIME=40 NITROGEN T.RATE=5.0 |
| DIFFUSION | TEMPERATURE=1200 TIME=&HVN.TIME NITROGEN |
| DIFFUSION | TEMPERATURE=1200 TIME=120 NITROGEN T.RATE=−2.5 |
| $DIFFUSION | TEMPERATURE=900 TIME=20 NITROGEN |
| COMMENT | N-TANK OXIDE 5300A - PYRO |
| $EPOSITION | OXIDE THICKNESS=0.53 |
| $IFFUSION | TEMPERATURE=900 TIME=20 NITROGEN TED |
| $IFFUSION | TEMPERATURE=900 THICKNESS=0.53 WETO2 |
| DIFFUSION | TEMPERATURE=900 TIME=325 NITROGEN |
| $IFFUSION | TEMPERATURE=900 TIME=20 NITROGEN |
| $RID | LAYER.1 DX=0.002 SPACES=300 XDX=0.0 |
| COMMENT | TANK ETCH - NITRIDE & 1ST OXIDE ON P-AREA |
| $ETCH | NITRIDE |
| $ETCH | OXIDE THICKNESS=0.04 |

-continued
APPENDIX A

```
COMENT          PAD OXIDE 1 - 400A O2/H2/HCL
DEPOSITION      OXIDE THICKNESS=0.04
DIFFUSION       TEMPERATURE=900 TIME=20 NITROGEN
$DIFFUSION      TEMPERATURE=900 THICKNESS=0.04 WETO2
                HCL%=4.5
DIFFUSION       TEMPERATURE=900 TIME=20 NITROGEN
$RID            LAYER.1 DX=0.002 SPACES=300 XDX=0.0
COMMENT         LV P-TANK BORON IMPLANT
$IMPLANT        BORON DOSE=&LVP.DOSE ENERGY=40 RP.EFF
COMMENT         HV P-TANK BORON IMPLANT
IMPLANT         BORON DOSE=&HVP.DOSE ENERGY=40 RP.EFF
COMMENT         N-TANK & P-TANK DRIVE
DIFFUSION       TEMPERATURE=900 TIME=20 NITROGEN TED
DIFFUSION       TEMPERATURE=900 TIME=40 NITROGEN
                T.RATE=5.0
DIFFUSION       TEMPERATURE=1100 TIME=500 NITROGEN
DIFFUSION       TEMPERATURE=1100 TIME=80 NITROGEN
                T.RATE=-2.5
DIFFUSION       TEMPERATURE=900 TIME=20 NITROGEN
GRID            LAYER.1 DX=0.002 SPACES=300 XDX=0.0
COMMENT         EE_VTP BORON IMPLANT
$IMPLANT        BORON DOSE=&EVTP.DOS ENERGY=40 RP.EFF
LOOP            OPTIMIZE PRINT
ASSIGN          NAME=EVTN.DOS N.VALUE=5.0E11 LOWER=1.0E11
                UPPER=1.0E12 OPTIMIZE
COMMENT         EE_VTN BORON IMPLANT
IMPLANT         BORON DOSE=&EVTN.DOS ENERGY=40 RP.EFF
COMMENT         GATE OXIDE FOR EEPROM HIGH VOLTAGE
                TRANSISTORS
DIFFUSION       TEMPERATURE=900 TIME=20 NITROGEN
DIFFUSION       TEMPERATURE=900 THICKNESS=0.05 WETO2
                HCL%=4.5
DIFFUSION       TEMPERATURE=900 TIME=20 NITROGEN
GRID            LAYER.2 DX=0.002 SPACES=25 XDX=0.0
COMMENT         POLY GATE
DEPOSIT         POLYSILICON THICKNESS=0.45 TEMPERATURE=620
DIFFUSION       TEMPERATURE=950 TIME=20 SS.PHOSPHOROUS
ELECTRICAL      STEPS=18 VTH.ELEC LAYER=1
                FILE=&IN.FILE".elec.out"  PRINT
$+              MIN.REG=2
BIAS            LAYER=3 V-0.0 DV=.1 ABSCRISSA
QSS             LAYER=1 CONC=5E10
END
$
$               IF THERE IS AN N REGION ON A P SUBSTRATE, YOU WOULD
$               ALSO SPECIFY MIN.REG=2 TO INDICATE THAT YOU DID NOT
$               WANT TO INCLUDE THE CONDUCTANCE OF THE P SUBSTRATE
$               (REGION 1) IN THE VT CALCULATION (DETERMINED FROM
$               THE MAXIMUM SLOPE OF THE HOLE CONDUCTANCE FOR ALL
$               INCLUDED REGIONS IN PARALLEL).
EXTRACT         NAME=VT V.THRESHOLD
EXTRACT         V.THRESH NAME=VT TARGET=0.85
L.END
PRINT           LAYERS
PLOT            BORON ACTIVE BOTTOM=1E14 TOP=1E17
                RIGHT=2.0
LABEL           X=1.0 Y=5E16 LABEL=HV_PWELL_DOSE:
LABEL           X=8.0 Y=5E18 LABEL=&HVP.DOSE
SAVEFILE        FILE=&IN.FILE".save" ALL
COMMENT         P.O DEPOSITION - PSG (6000A) +
                OXIDE (8000A)
PRINT           NET ACTIVE CONCENTRATION
STOP
```

What is claimed is:

1. A system for designing an integrated circuit comprising:

means for determining semiconductor devices comprising the integrated circuit;

means for determining desired device performance parameters for the devices;

means for determining a flow of process steps to fabricate the devices;

means for simulating said flow of process steps in one dimension to derive device performance parameters associated with the devices;

means for comparing said derived device performance parameters with said desired device performance parameters;

means for modifying one of said process steps of said desired device parameters if said derived device performance parameters from said derived performance parameters, are more than a selected difference; and wherein the modified process steps are resimulated and redetermined until the derived parameters meet the desired parameters;

means for simulating said flow of process steps in two dimensions to derive 2-D device performance parameters associated with the devices;

means for comparing said derived 2D device performance parameters with said desired device performance parameters; and means for modifying one of said process steps or said desired device parameters wherein the flow of process steps is resimulated in one dimension if said derived 2-D device performance parameters are more than a selected difference from said derived device performance parameters.

2. The system of claim 1 wherein said means for simulating said process flow in one dimension comprises means for calculating dopant concentrations in one dimension.

3. The system of claim 2 wherein said means for simulating said process flow comprises means for calculating voltage threshold characteristics of one or more of said desired devices.

4. The system of claim 3 wherein said means for simulating said process flow includes means for simulating junction breakdown characteristics of one or more of said desired devices.

5. The system of claim 3 wherein said means for simulating said process flow includes means for simulating voltage breakdown characteristics of one or more of said desired devices.

6. The system of claim 2 wherein said means for simulating said process flow comprises means for calculating voltage-current characteristics of one or more said desired devices.

7. The system of claim 1 wherein said means for simulating said process flow in two dimensions comprises means for calculating dopant concentrations in two dimensions.

8. The system of claim 1 and further comprising means for preparing a layout of said integrated circuit.

9. The system of claim 8 and further comprising means for fabricating said integrated circuit.

10. The system of claim 1 wherein said means for determining a flow of process steps comprises means for determining a process flow using a top-down approach.

11. The system of claim 1 wherein said devices are selected from the group consisting of capacitors, EPROMs, EEPROMs, transistors, thyristors, diodes, resistors, or combinations thereof.

12. A system for designing an integrated circuit comprising:
means for defining specifications for the integrated circuit;
means for selecting devices to be used in implementing the integrated circuit;
means for defining a range of predetermined targets for said devices of said integrated circuit;
means for defining a flow of process steps used in forming the devices on a semiconductor wafer;
means for performing simulations on said process flow to determine dopant concentrations in one dimension; wherein the process flow is redefined and one-dimensional simulations are performed until said predetermined targets are met until said dopant concentrations are within a selected range of said predetermined targets;
means for performing two-dimensional simulations on said process flow to determine electrical parameters associated with the devices; wherein the process flow is redefined and two-dimensional simulations are performed until predetermined electrical parameters are met; and
means for performing circuit simulations of a circuit comprising said selected devices.

13. The system of claim 12 wherein said means for performing two-dimensional simulations comprises means for performing simulations to determine two-dimensional dopant concentrations associated with the devices and calculating device parameters responsive to said two-dimensional dopant concentrations.

14. The system of claim 12 and further comprising means for performing three-dimensional simulations to determine electrical parameters associated with the devices based on dopant concentrations in three dimensions.

15. The system of claim 14 and further comprising means for repeating said steps of defining a process flow and performing three-dimensional simulations until predetermined electrical parameters associated with the devices based on dopant concentrations in three dimensions are met.

16. The system of claim 12 and further comprising means for fabricating a test model of said integrated circuit alter said step of performing circuit simulation.

17. The system of claim 12 wherein said means for defining parameters includes means for defining voltage threshold and transconductance parameters for MOS transistors.

18. The system of claim 12 wherein said means for defining parameters includes means for defining nominal capacitance, voltage coefficient of capacitance, temperature coefficient of capacitance, and breakdown for capacitors.

19. The system of claim 12 wherein said means for of defining parameters includes means for defining turn on voltage and reverse blocking voltage for thyristors.

20. The system of claim 12 wherein said means for defining parameters includes means for defining forward voltage drop and reverse ledge current for diodes.

21. The system of claim 12 wherein said means for defining parameters includes means for defining nominal resistance and temperature coefficient and voltage coefficient for resistors.

22. The system of claim 12 wherein said means for defining parameters includes means for defining gain and base-collector breakdown voltage for bipolar transistors.

23. The system of claim 12 wherein said means for defining parameters includes means for defining a programming voltage for EPROMs.

24. The system of claim 12 wherein said means for defining parameters includes means for defining a programming voltage for EEPROMs.

25. The system of claim 12 wherein said devices are selected from the group consisting of capacitors, EPROMs, EEPROMs, transistors, thyristors, diodes, resistors, or combinations thereof.

* * * * *